(12) United States Patent
Chinnakkonda Vidyapoornachary et al.

(10) Patent No.: US 9,858,145 B2
(45) Date of Patent: *Jan. 2, 2018

(54) SELECTIVE ERROR CODING

(71) Applicant: International Business Machines Corporation, Armonk, NY (US)

(72) Inventors: Diyanesh Babu Chinnakkonda Vidyapoornachary, Bangalore (IN); Timothy J. Dell, Colchester, VT (US); Marc A. Gollub, Round Rock, TX (US); Anil B. Lingambudi, Karnataka (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 139 days.

This patent is subject to a terminal disclaimer.

(21) Appl. No.: 14/835,790

(22) Filed: Aug. 26, 2015

(65) Prior Publication Data

US 2016/0357629 A1    Dec. 8, 2016

Related U.S. Application Data

(63) Continuation of application No. 14/732,945, filed on Jun. 8, 2015.

(51) Int. Cl.
*G06F 11/10* (2006.01)
*G11C 29/52* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .. G06F 11/1076; G06F 11/1004; G06F 11/10; G06F 11/109; G06F 11/1068;
(Continued)

(56) References Cited

U.S. PATENT DOCUMENTS

| | | | |
|---|---|---|---|
| 2007/0043983 A1* | 2/2007 | Kuo .................. | G11C 29/52 714/718 |
| 2012/0198309 A1* | 8/2012 | Alves ................. | G06F 11/10 714/763 |
| 2014/0281681 A1* | 9/2014 | Cordero ............ | G06F 11/1469 714/6.3 |

OTHER PUBLICATIONS

List of IBM Patents or Patent Applications Treated as Related; (Appendix P), Filed Aug. 26, 2015; 2 pages.
(Continued)

*Primary Examiner* — April Y Blair
*Assistant Examiner* — Sazzad Hossain
(74) *Attorney, Agent, or Firm* — Cantor Colburn LLP; Robert Williams

(57) ABSTRACT

A system and method of performing selective error coding in memory management of a memory device are described. The method includes performing a process of detecting and correcting memory errors in the memory of the memory device either prior to or after a chip mark associated with the memory device is in place. The method also includes localizing hard errors of the memory device based on a second process of detecting the memory errors in the memory of the memory device, the hard errors being persistent memory errors that persist from the process of detecting and correcting the memory errors to the second process, determining an extent of the hard errors based on the localizing, and preventing placement of the chip mark or removing the chip mark after de-allocating one or more ranges of addresses based on a result of the determining the extent of the hard errors.

8 Claims, 4 Drawing Sheets

(51) Int. Cl.
*G06F 3/06* (2006.01)
*G11C 29/42* (2006.01)
*G11C 29/44* (2006.01)
*G11C 11/401* (2006.01)

(52) U.S. Cl.
CPC .......... *G06F 3/0652* (2013.01); *G06F 3/0679* (2013.01); *G06F 11/106* (2013.01); *G11C 29/42* (2013.01); *G11C 29/44* (2013.01); *G11C 29/52* (2013.01); *G11C 11/401* (2013.01)

(58) Field of Classification Search
CPC ...... G06F 3/0619; G06F 3/064; G06F 3/0652; G06F 3/0679; G06F 11/106; G11C 29/42; G11C 29/44; G11C 29/52; G11C 11/401
See application file for complete search history.

(56) References Cited

OTHER PUBLICATIONS

Diyanesh Babu Chinnakkonda Vidyapoornachary et al., "Selective Error Coding", U.S. Appl. No. 14/732,945, filed Jun. 8, 2015.
Timothy J. Dell et al., "Bank-Level Fault Management in a Memory System", U.S. Appl. No. 14/301,611, filed Jun. 11, 2014.
Timothy J. Dell et al., "Bank-Level Fault Management in a Memory Systemn", U.S. Appl. No. 14/506,783, filed Oct. 6, 2014.

\* cited by examiner

SELECTIVE ERROR CODING

DOMESTIC BENEFIT/NATIONAL STAGE INFORMATION

This application is a continuation of U.S. application Ser. No. 14/732,945 filed Jun. 8, 2015, the disclosure of which is incorporated by reference herein in its entirety.

BACKGROUND

The present invention relates to error correction coding (ECC), and more specifically, to selective error coding.

In some applications, writing to memory includes writing to one of multiple memory devices. For example, a server memory is comprised of a number of memory devices such as dynamic random-access memory (DRAM) chips. Writing data to memory of the server typically involves writing to multiple DRAM chips. To ensure that data is correctly written and retrieved, ECC bits are generally written along with the data so that the ECC bits may be verified in the read data. The ECC bits are included with stored data through an encoding process and are verified in read data through a decoding process. Processing of the ECC bits by a decoder may lead to the inclusion of a chip mark. The chip mark identifies one of the DRAMs and indicates that all data from that DRAM must be corrected. Processing of the ECC bits may also lead to the inclusion of a symbol mark. A symbol is a subset of the addresses of one DRAM. The number of addresses in a range defined as a symbol may differ based on the memory device. Thus, the symbol mark identifies that data from a subset of addresses of one of the DRAMs must be corrected.

SUMMARY

According to one embodiment, a method of performing selective error coding in memory management of a memory device includes performing, using a processor, a process of detecting and correcting memory errors in the memory of the memory device either prior to or after a chip mark associated with the memory device is in place, the chip mark indicating all addresses of the memory device as bad; localizing hard errors of the memory device, using the processor, based on a second process of detecting the memory errors in the memory of the memory device, the hard errors being persistent memory errors that persist from the process of detecting and correcting the memory errors to the second process; determining an extent of the hard errors based on the localizing; and preventing placement of the chip mark or removing the chip mark to resume memory use of the memory device after de-allocating one or more ranges of addresses of the memory of the memory device based on a result of the determining the extent of the hard errors.

According to another embodiment, a system to perform selective error coding includes a memory device configured to store data at memory addresses; and a controller configured to perform a process of detecting and correcting memory errors in memory of the memory device prior to or after placing a chip mark on the memory device, the chip mark indicating that all the memory addresses of the memory device are bad, localize hard errors based on performing a second process of detecting the memory errors in the memory device, the hard errors being persistent memory errors that persist from the process of detecting and correcting the memory errors to the second process, determine an extent of the hard errors; and prevent placement of the chip mark or remove the chip mark based on a result of determining the extent of the hard errors.

According to yet another embodiment, a computer program product to perform selective error coding in a memory device includes a computer readable storage medium having program code embodied therewith, the program code executable by a processor for performing a process of detecting and correcting memory errors in the memory of the memory device either prior to or after a chip mark associated with the memory device is in place, the chip mark indicating all addresses of the memory device as bad localizing hard errors of the memory device based on a second process of detecting the memory errors in the memory of the memory device, the hard errors being persistent memory errors that persist from the process of detecting and correcting the memory errors to the second process; determining an extent of the hard errors based on the localizing; and preventing placement of the chip mark or removing the chip mark to resume memory use of the memory device after de-allocating one or more ranges of addresses of the memory of the memory device based on a result of the determining the extent of the hard errors.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted ECC bits are included with stored data to verify the data when it is retrieved from one or more DRAMs. Processing or decoding of the ECC bits in data read from a DRAM may result in a chip mark that marks one DRAM as defective and indicates that data retrieved from that DRAM must be corrected. However, the use of a chip mark is at a cost of diminished error detection and correction following the chip mark. Embodiments of the systems and methods detailed herein relate to determining if the use of a chip mark may be avoided and managing memory to avoid the use of a chip mark when possible. The embodiments detailed below relate to differentiating (persistent) hard errors that indicate a fault at a memory location from random and temporary soft errors that result, for example, in one bit of data being flipped. The embodiments ensure that a chip mark is used when a threshold number of hard errors is exceeded for a given DRAM but avoid the use of a chip mark under other circumstances.

Figure 1:
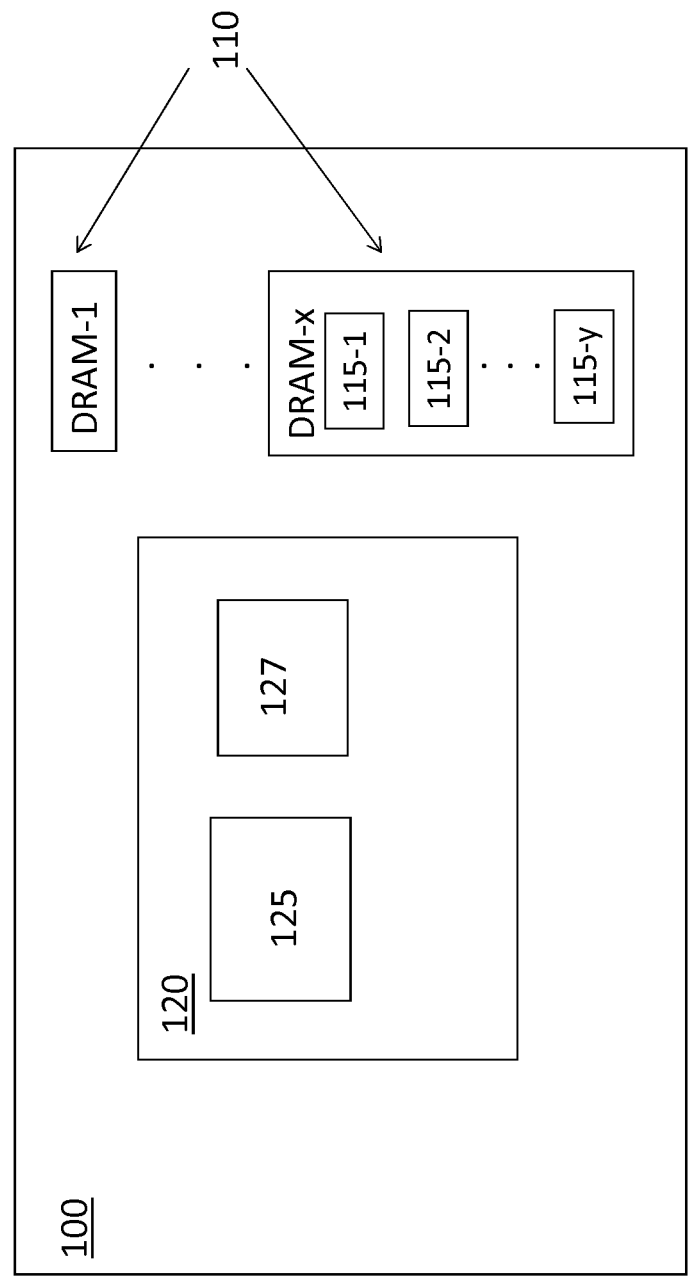
FIG. 1 is a block diagram of an exemplary system in which multiple DRAMs are accessed according to embodiments of the invention.

FIG. 1 is a block diagram of an exemplary system 100 in which multiple DRAMs 110 (memory chips, memory devices) are accessed according to embodiments of the invention. Each DRAM 110 may include a number of banks 115. A bank 115 is a subset of the rank or address range of the entire DRAM 110. The system 100 may be a server, for example. The components and activities of the processing portion 120 of the system 100 that are discussed herein relate specifically to memory management. The processing portion 120 or processing circuit includes hardware, firmware, and software to implement the functions discussed herein. The processing portion 120 of the system 100 may include many other components and activities directed to other functions of the system 100. The processing portion 120 includes a hypervisor 125 that manages memory use and a scrub engine 127 that fixes errors in memory. Collectively, the processing portion 120 (hardware, firmware, software) pertinent to memory management may be referred to as the fault isolation and recover (FIR) controller.

Figure 2:
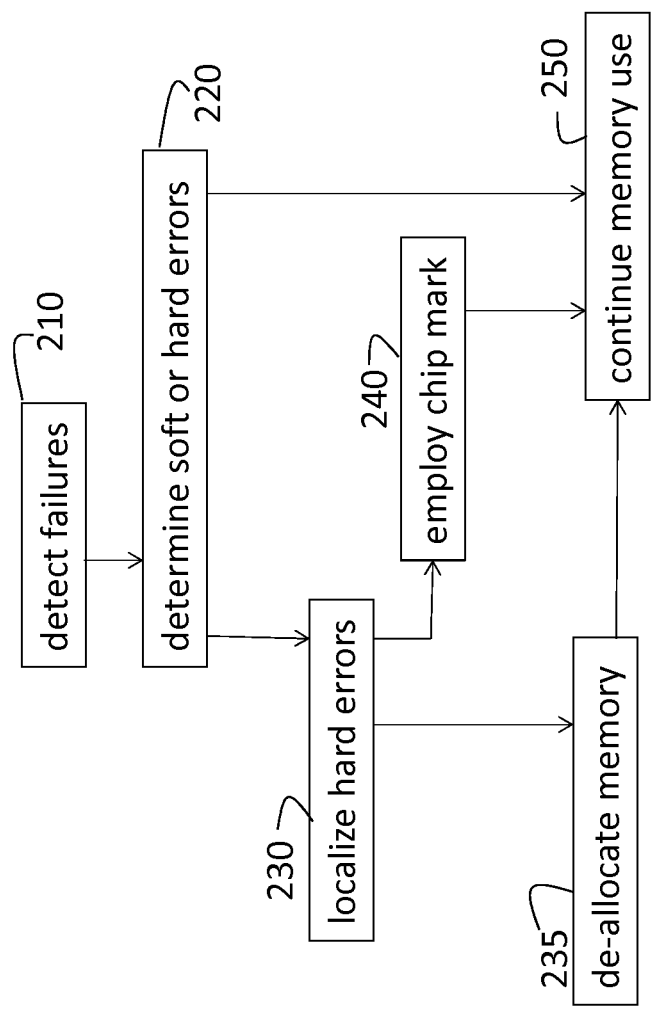
FIG. 2 is a process flow of selective error coding in memory management according to one embodiment of the invention.

FIG. 2 is a process flow of the general methodology of selective error coding in memory management according to one embodiment. The present embodiment is directed to preventing the placement of a chip mark when possible. At block 210, the process includes detecting failures in data read from memory. The failure detection may be part of a scrubbing process, as described for the embodiment shown in FIG. 3. Memory scrubbing entails reading from each memory location, correcting bit errors based on the error-correcting code that is embedded in the data, and writing back corrected data. This process requires redundancy in the stored data in order to facilitate correction of bit errors in the data. At block 220, determining soft errors or hard errors among the failures detected by the scrubbing may require more than one scrubbing process. This is because an incorrect bit must be corrected and then found to be incorrect again to ascertain if the error is persistent (thereby indicating a hard error). When it is determined (at block 220) that the errors are all soft errors, then a chip mark is avoided and memory use is continued at block 250. When it is determined that there are hard errors (as determined at block 220), localizing hard errors, at block 230, includes determining an extent of the hard errors (e.g., symbol-level, entire chip). A threshold may be set, for example, for the number of memory locations with hard errors to initiate inclusion of the chip mark. At block 240, employing a chip mark (i.e., the FIR controller (memory manager) placing a chip mark) is based on the result of block 230 indicating that the threshold number of memory locations (or more) include hard errors. On the other hand, if fewer than the threshold number of memory locations has hard errors (as determined at block 230), then those memory locations with hard errors are de-allocated from use at block 235 and memory use is continued at block 250. De-allocation may include de-allocation of the memory locations from future scrubbing, as well, according to an embodiment. In that case, the threshold used at block 230 to determine whether a chip mark should be employed may be adjusted to account for the already de-allocated memory locations. At block 250, continuing memory use also includes continuing periodic or non-periodic scrubbing. If the chip mark were employed (block 240), then memory use would continue (block 250), as well.

Figure 3:
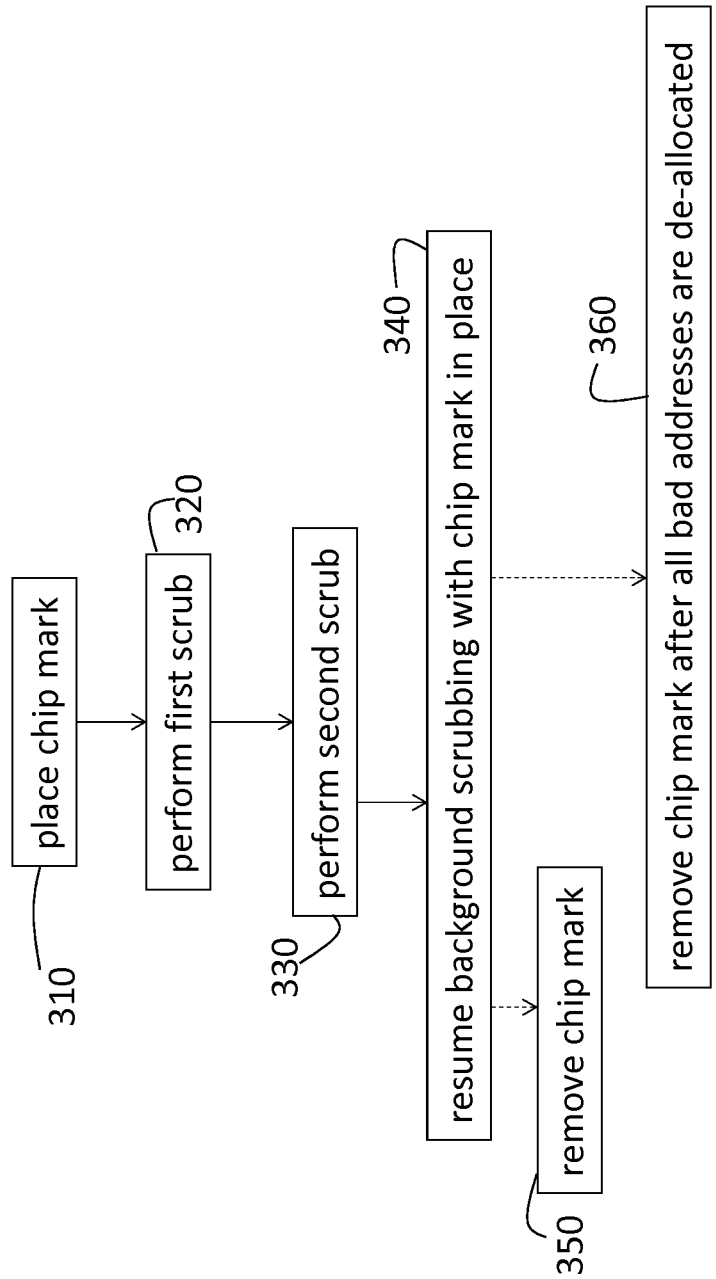
FIG. 3 is a process flow of a method of selective error coding in memory management according to another embodiment of the invention.

FIG. 3 is a process flow of a method of selective error coding in memory management according to another embodiment of the invention. While the embodiment discussed with reference to FIG. 2 relates to precluding the use of a chip mark when possible, the present embodiment relates to removal of a chip mark when possible. The processes discussed herein are implemented by the processing portion 120 of the system 100. At block 310, a chip mark is placed (FIR controller places a chip mark) on one of the DRAMs 110 based on detecting a multi-symbol fail during a read process, for example. At block 320, performing a first scrub includes performing a first scrub of rank (the address range of the entire DRAM 110). This first scrub process includes rewriting all the bad (failed) memory locations with good data to fix any potential soft errors. Soft errors are those that are not persistent because they are not caused by an actual fault at the memory location but, instead, on a glitch (or anomaly) in the writing process or reading process, for example. The first scrubbing process at block 320 is comparable to the detection of failures at block 210 (FIG. 2), for example. At the end of the first scrub, a second scrub is performed at block 330, which is detailed further with reference to FIG. 4. The second scrub at block 330 determines the extent of the failure and is comparable to the determination of hard or soft errors at block 220 (FIG. 2), for example.

Following this second scrub, background scrubbing is resumed, at block 340, with the chip mark still in place. Based on a result of the second scrub at block 330, the processes at blocks 350 or 360 may be performed, as detailed below. If neither the process at block 350 nor the process at block 360 is warranted by the result of the second scrub at block 330, then the chip mark is maintained. At block 350, removing the chip mark is performed if the second scrub (block 330) indicates only soft errors. That is, if no errors persist between the first scrub (block 320) and the second scrub (block 330), then the chip mark may be removed at block 350. At block 360, removing the chip mark after all the bad addresses (identified during the second scrub process, as detailed below) are de-allocated. De-allocation refers to both de-allocation of the memory locations exhibiting hard errors from use and de-allocation of the memory locations exhibiting hard errors from the subsequent background scrubbing (at block 340). If the memory locations exhibiting hard errors are not de-allocated from subsequent scrubbing, the chip mark would be placed again as a result of the subsequent background scrubbing, and the processes beginning at block 310 would be repeated continually. The process at block 310 may be modified (e.g., a threshold used to determine if the chip mark should be placed may be adjusted) to account for the de-allocated memory locations.

Figure 4:
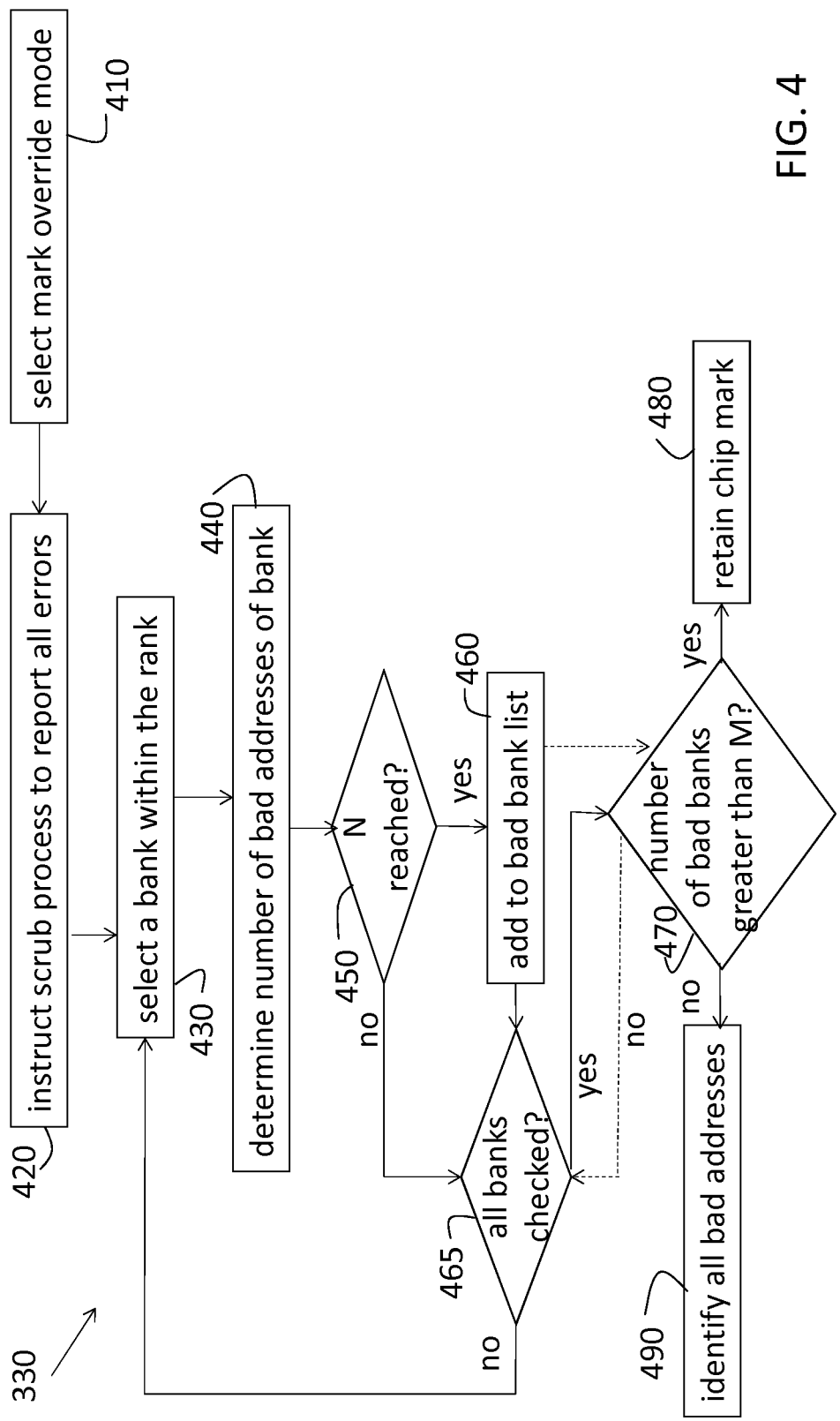
FIG. 4 is a process flow associated with performing the second scrub according to the embodiment of FIG. 3.

FIG. 4 is a process flow associated with performing the second scrub according to embodiments of the invention. Selecting mark override mode, at block 410, facilitates reads from a DRAM 110 with a chip mark so that errors in a marked chip may be detected. The scrub process reports all hard, soft, and intermittent multi-symbol and single-symbol errors according to an instruction issued at block 420. Then, for one bank 115 of the rank at-a-time (selected at block 430), the number of bad addresses of the bank 115 (memory locations with hard errors) is determined at block 440. A rank may typically be subdivided into 4-8 banks 115. At block 450, whether or not N bad addresses were reached in the selected bank 115 is determined. In alternate embodiments, the determination, at block 440, of the number of bad addresses of the bank 115 and the check at block 450 may be performed after all the addresses of the bank 115 have been checked or as a continuous count such that, when it is determined that N bad addresses have been found for a bank 115, at block 450, the check of addresses of the bank 115 may be stopped. If N bad addresses have been added to the bad address list for the bank 115, the bank 115 is added to a bad bank list at block 460.

After this addition or if N bad addresses were not added to the bad address list for the bank 115 after all the addresses of the bank 115 were checked (the "no" result at block 450), it is determined, at block 465, if all the banks 115 of the DRAM 110 have been checked. When all banks 115 of the DRAM 110 have not been checked, the process at block 430 is repeated for the next bank 115. When all banks 115 of the DRAM 110 have been checked, the process at block 470 is performed. At block 470, whether or not M bad banks 115 were added to the bad bank list is determined. Every bank 115 of the rank may be selected at block 430 prior to making the check at block 470, as shown in FIG. 4. In alternate embodiments (indicated by the dashed line from block 460 to block 470), the check at block 470 may be performed after each addition to the bad bank list (at block 460) so that additional banks 115 are not unnecessarily checked after M bad banks 115 have already been found. In this case, if the number of bad banks 115 at block 470 is not greater than M, processing returns to the check at block 465 as indicated by the dashed line. If M banks 115 have been added to the bad bank list (when checked at block 470), then the chip mark is retained for the rank (DRAM 110) at block 480. In this case, processing would not proceed to block 350 or block 360 shown at FIG. 3. If M banks 115 are not added to the bad bank list after all the banks 115 of the rank are processed, then all the bad addresses are identified at block 490 for de-allocation at block 360 (FIG. 3). That is, for banks 115 that have N or more bad addresses, the entire address range of the bank 115 may be indicated as bad addresses (i.e., the entire bank 115 is de-allocated at block 360 (FIG. 3)). For banks 115 that have fewer than N bad addresses, the specific bad addresses are indicated. These are the addresses that are de-allocated at block 360 (FIG. 3).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of performing selective error coding in memory management of a memory device, the method comprising:
    performing, using a processor, a process of detecting and correcting memory errors in the memory of the memory device either prior to or after a chip mark associated with the memory device is in place, the chip mark indicating all addresses of the memory device as bad;
    localizing hard errors of the memory device, using the processor, based on a second process of detecting the memory errors in the memory of the memory device, the hard errors being persistent memory errors that persist from the process of detecting and correcting the memory errors to the second process;
    determining an extent of the hard errors based on the localizing; and
    preventing placement of the chip mark or removing the chip mark to resume memory use of the memory device after de-allocating one or more ranges of addresses of the memory of the memory device based on a result of the determining the extent of the hard errors.

2. The method according to claim 1, wherein the performing the process of detecting and correcting the memory errors includes a first scrubbing process to correct soft errors.

3. The method according to claim 1, wherein the second process of detecting the memory errors includes a second scrubbing process.

4. The method according to claim 3, wherein the localizing the hard errors includes determining a number of sub-regions of the memory that are bad.

5. The method according to claim 4, wherein the determining the number of sub-regions of the memory that are bad includes determining the number of sub-regions of the memory with greater than a first threshold number of addresses that are bad.

6. The method according to claim 4, wherein the determining the extent of the hard errors includes determining whether the number of sub-regions of the memory that are bad is below a second threshold.

7. The method according to claim 6, wherein the preventing the placement of the chip mark or the removing the chip mark is done when the number of sub-regions of the memory that are bad is below the second threshold.

8. The method according to claim 6, wherein placing the chip mark or maintaining the chip mark is done when the number of sub-regions of the memory that are bad is above the second threshold.

\* \* \* \* \*